US006669777B2

(12) United States Patent
Kononchuk et al.

(10) Patent No.: US 6,669,777 B2
(45) Date of Patent: *Dec. 30, 2003

(54) METHOD OF PRODUCING A HIGH RESISTIVITY SILICON WAFER UTILIZING HEAT TREATMENT THAT OCCURS DURING DEVICE FABRICATION

(75) Inventors: Oleg V. Kononchuk, Brush Prairie, WA (US); Sergei V. Koveshnikov, Vancouver, WA (US); Zbigniew J. Radzimski, Brush Prairie, WA (US); Neil A. Weaver, Battle Ground, WA (US)

(73) Assignee: SEH America, Inc., Vancouver, WA (US)

( * ) Notice: Subject to any disclaimer, the term of this patent is extended or adjusted under 35 U.S.C. 154(b) by 112 days.

This patent is subject to a terminal disclaimer.

(21) Appl. No.: 10/008,402

(22) Filed: Dec. 6, 2001

(65) Prior Publication Data
US 2003/0106486 A1 Jun. 12, 2003

(51) Int. Cl.[7] ............................................... C30B 15/20
(52) U.S. Cl. ............................... 117/36; 117/84; 117/89
(58) Field of Search ............................. 117/13, 36, 84, 117/89

(56) References Cited

FOREIGN PATENT DOCUMENTS

EP          1 087 041 A1      3/2001

Primary Examiner—Felisa Hiteshew
(74) Attorney, Agent, or Firm—Alston & Bird, LLP

(57) ABSTRACT

A high resistivity wafer which does not exhibit diminishing resistivity after device installation and method of making the high resistivity wafer comprising a) using the CZ method to grow a silicon single crystal ingot with a resistivity of 100 $\Omega$·cm or more, preferably 1000 $\Omega$·cm or more, and an initial interstitial oxygen concentration of 10 to 40 ppma, b) processing the ingot into a wafer, c) determining the total amount of heat treatment required to reduce the interstitial oxygen content of the wafer to about 8 ppma or less, d) determining the amount of heat treatment which will take place during the device fabrication process after wafer fabrication, e) subjecting the wafer to a partial oxygen precipitation heat treatment equivalent to the total amount of heat treatment, less the amount of heat treatment that will occur during device fabrication.

19 Claims, 1 Drawing Sheet

METHOD OF PRODUCING A HIGH RESISTIVITY SILICON WAFER UTILIZING HEAT TREATMENT THAT OCCURS DURING DEVICE FABRICATION

FIELD OF THE INVENTION

The present invention relates to a method of producing a high-resistivity silicon wafer. More particularly, the present invention relates to a method of producing a high-resistivity silicon wafer which utilizes heat treatment during device fabrication to obtain a wafer with a predetermined resistivity.

BACKGROUND OF THE INVENTION

High resistivity silicon wafers have conventionally been used for power devices such as high-voltage power devices and thyristors. More recently, C-MOS devices, Schottky barrier diodes, and other semiconductor devices for use in mobile communications have been developed which require the use of high-resistivity silicon wafers. The high-resistivity wafers tend to decrease the effects of parasitic capacitance among the devices of the wafer, allowing the devices to be more closely packed upon the surface of the wafer while, at the same time, reducing signal transmission loss among the devices.

The resistivity of the silicon wafer influences and affects the operation of the devices installed upon the surface of the wafer. Devices and circuits are engineered to operate on substrates having particular resistivity values. If the resistivity value of the wafer is different from that which the circuit is designed for, or if the resistivity value of the wafer varies during operation of the circuit, the circuit is likely to fail. Thus, by the time the circuit becomes operational, the resistivity must be set at the proper value and must remain constant during the life of the circuit.

High-resistivity wafers are generally defined as those silicon wafers with resistivity of 100 Ω·cm or greater, and typically have resistivity of 1000 Ω·cm or greater. The initial resistivity of a wafer is established during crystal growth by the precise addition of dopants to the molten polysilicon from which the silicon crystal is formed. By doping, the resistivity of the crystals can be controlled within close tolerances. However, the initial resistivity may be altered, desirably or undesirably, during subsequent processing of the wafer such that the final resistivity of the wafer may be very different from the resistivity directly after crystal growth. For instance, heat treatment during installation of devices within the surface portion of the wafer often causes undesirable variations in the resistivity of the wafer.

In order to form more devices from a single wafer and therefore reduce the cost per device, larger wafers are generally preferred. As such, while high resistivity silicon wafers may be fabricated by a float zone technique, the limitations on one size of the resulting wafers make the Czochralski (CZ) crystal growing method the desired fabrication technique. The CZ method allows wafers having diameters of 200 mm, 300 mm, 400 mm, or larger to be produced. In addition to the large wafer diameter, the CZ method also provides wafers with excellent planar resistivity distribution. Good planar resistivity distribution means that the wafer has only minimal variations in resistivity along the plane which was perpendicular to the growth direction of the crystal during crystal growth.

Unfortunately, there are some problems related to the presence of oxygen during the growth of high-resistivity silicon wafers in a CZ apparatus. During crystal growth within a CZ apparatus, oxygen from the quartz crucible tends to be introduced into the silicon crystal and is maintained in the interstitial spaces of the silicon crystal lattice. The interstitial oxygen atoms are normally electrically neutral, but the oxygen atoms tend to agglomerate as oxygen-containing thermal donors (OTDs), which become electron donors when subjected to heat in the range of 350° C. to 500° C. Because of electron donation from the OTDs, the resistivity of the wafer may be unfavorably decreased by relatively mild heat treatments subsequent to wafer fabrication. The decrease in resistivity due to the oxygen is especially problematic since temperatures in the range of 350° C. to 500° C. are commonly encountered during device installation process steps which occur subsequent to wafer fabrication, such as during device fabrication.

The seemingly obvious solution of eliminating oxygen from the silicon lattice is not a complete solution to the problem of resistivity variation within a silicon wafer. The presence of oxygen within the silicon crystal causes bulk defects to form within the crystal. Though large numbers of bulk defects are not desired, small numbers of bulk defects contribute to a gettering effect within the crystal. By gettering, the oxygen derived defects within the crystal act to trap metallic and mobile ionic contamination and to prevent the contamination from traveling to the surface of the wafer. The gettering effect is very important in protecting the devices on the surface of the wafer from interference from the contaminants. Thus, some oxygen is desirable, although too much oxygen is disadvantageous in that it will likely decrease the resistivity of the silicon wafer.

As described in European Patent Office publication EP 1087041 A1, incorporated herein by reference, there is known a method of producing a high-resistivity wafer having a high gettering effect while preventing the reduction of resistivity due to electrons being donated from OTDs upon subsequent heating cycles of the wafer. The method includes first producing a single crystal ingot having a resistivity of 100 Ω·cm or greater and an initial interstitial oxygen concentration of 10 to 25 parts per million atomic (ppma) by a CZ method. Interstitial oxygen is then precipitated with a gettering heat treatment step until the residual interstitial oxygen concentration in the wafer becomes about 8 ppma or less. The precipitated oxygen does not have the ability to donate electrons like the OTDs formed from the free interstitial oxygen so subsequent heat treating processes do not further reduce the resistivity of the wafer.

The use of the gettering heat treatment is capable of reducing the oxygen content in a wafer having a resistivity of a 100 Ω·cm or more from 10 to 25 ppma to 8 ppma or less while generating or maintaining a bulk defect density of $1 \times 10^8$ to $2 \times 10^{10}$ defects/cm$^3$. This number of defects is sufficient to provide gettering to the wafer in order to trap contaminants and prevent the contaminants from moving to the surface of the wafer. The wafer described above will maintain a consistent high resistivity through subsequent low temperature heat treatments, such as device heat treatments at 350° C. to 500° C., while maintaining sufficient gettering effect.

The main drawback with the above described gettering heat treatment, however, is the process time required to precipitate the oxygen within the wafer. Typically, for example, the heat treatment process may require a first heating step of 800° C. for 4 hours, a second heat treating step of 1000° C. for 10 hours, and a third heat treatment step of 1050° C. for 6 hours. The extended process time required to maintain the wafer at temperature until the oxygen content of the wafer is reduced from 10 to 25 ppma to 8 ppma or less lowers the overall efficiency of the wafer making process, both in terms of time and in terms of power requirements.

What is needed is a method of providing for the oxygen precipitation heat treatment of a high-resistivity wafer in which oxygen content of the wafer is reduced from 10–25 ppma to 8 ppma or less and in which the bulk defect density is $1 \times 10^8$ to $2 \times 10^{10}$ defects/cm$^3$ without the time delay and industrial expense associated with a complete oxygen precipitation heat treatment prior to the device fabrication stage of wafer production.

SUMMARY OF THE INVENTION

The invention is a method of treating a high-resistivity silicon wafer containing interstitial oxygen in such a way that the oxygen is largely precipitated, which prevents the oxygen from acting as an electron donor and prevents the resistivity of the wafer from diminishing. The invented method recognizes that heat treatment often occurs during fabrication of devices upon the surface of the wafer. The method calculates the heat treatment that will occur in the device fabrication stage. The wafer is then heat treated to an intermediate oxygen precipitation value with the expectation that the heat treatment which occurs during device fabrication will provide the additional precipitation needed to reach a final desired precipitation value.

The invented method comprises a) using the CZ method to grow a silicon single crystal ingot with a resistivity of 100 $\Omega \cdot$cm or more and an initial interstitial oxygen concentration of 10 to 40 ppma, b) processing the ingot into a wafer, c) determining the total amount of heat treatment required to reduce the interstitial oxygen content of the wafer to about 8 ppma or less, d) determining the amount of heat treatment which will take place during the device fabrication process after wafer fabrication, e) subjecting the wafer to a partial oxygen precipitation heat treatment equivalent to the total amount of heat treatment, less the amount of heat treatment that will occur during device fabrication.

The first step of the precipitation heat treatment preferably occurs in the temperature range of about 600° C. to about 800° C. This temperature range is optimum for creation of nucleation sites for oxygen precipitation. The nucleation sites provide for precipitation both during the wafer production and device fabrication stages.

Rather than providing the heat treatment needed to precipitate the desired amount of oxygen, the invented method anticipates heat treatments that will occur in subsequent processing steps and only provides heat treatments to precipitate the oxygen to an intermediate value. Later processes, such as device fabrication, provide the thermal energy required to precipitate the oxygen to a final value. Thus, energy and time are conserved during the wafer fabrication process.

BRIEF DESCRIPTION OF THE DRAWINGS

Figure 1:
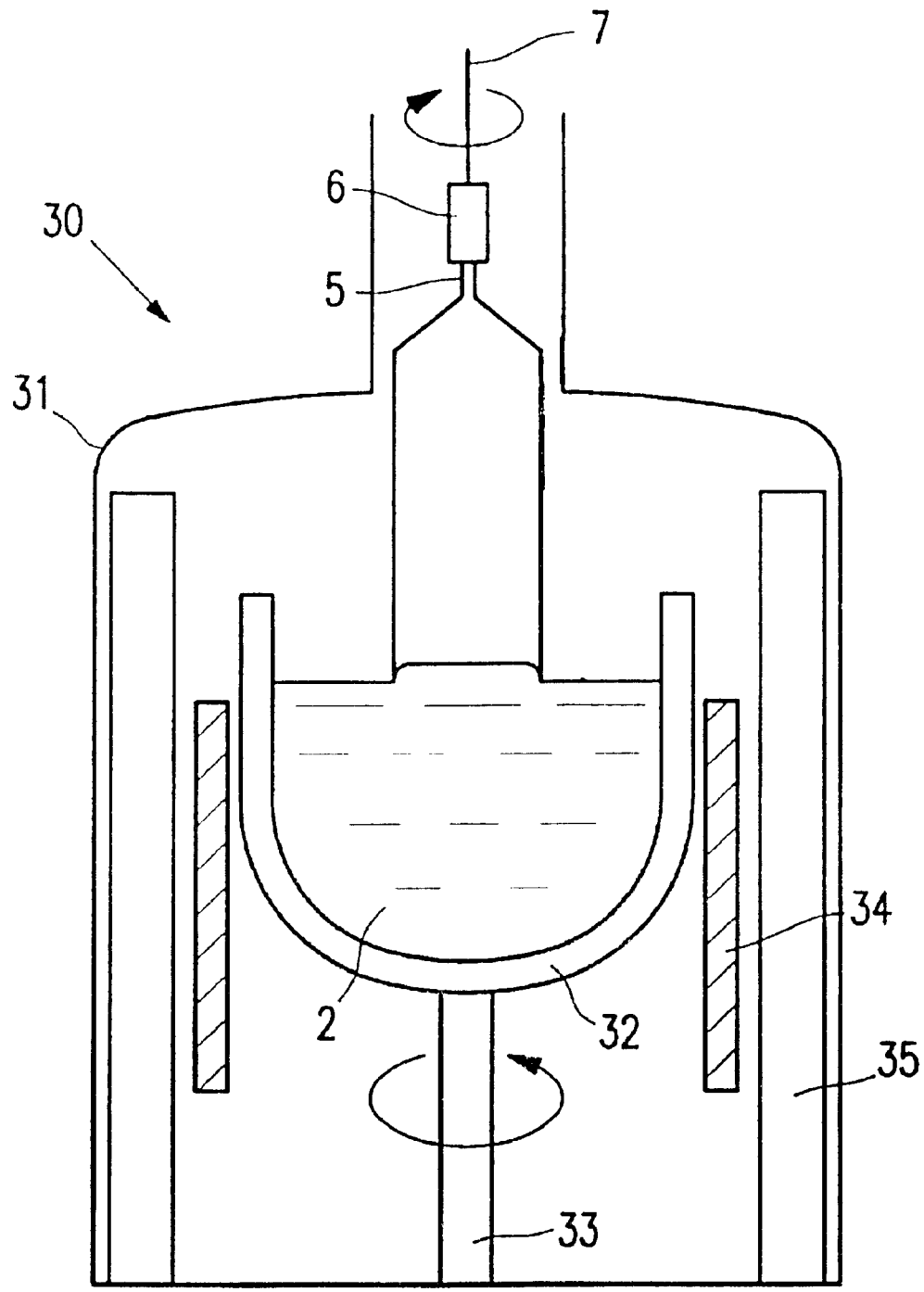

Having thus described the invention in general terms, reference will now be made to the accompanying drawing, which is not necessarily drawn to scale, and wherein:

FIG. 1 illustrates an exemplary Czochralski crystal growing apparatus.

DETAILED DESCRIPTION OF THE INVENTION

The present invention now will be described more fully hereinafter with reference to the accompanying drawing. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As mentioned, EP 1087041 discloses a method of obtaining a wafer exhibiting high resistivity and high gettering effect while preventing a later reduction of resistivity of the wafer due to the generation of oxygen donors by using the CZ method to grow a silicon single crystal ingot having a resistivity of 100 $\Omega \cdot$cm or more and an initial interstitial oxygen concentration of 10 to 25 ppma. The high resistivity ingot is then processed into a wafer, and the wafer is subjected to an oxygen precipitation heat treatment whereby the residual interstitial oxygen content in the wafer is reduced to about 8 ppma or less. The resulting wafer has high resistivity and increased gettering ability. Most significantly, the resistivity of the resulting wafer does not change when the wafer is subjected to further heat treatments subsequent to wafer fabrication.

The invented method overcomes the problems of process delay and excess energy usage by utilizing heat treatments associated with the fabrication of devices upon the surface portion of a silicon wafer to provide some or all of the heat treatment required to precipitate oxygen within the wafer and to provide a high resistivity wafer which has a residual oxygen content of 8 ppma or less and which resists change in resistivity upon subsequent heat treatments.

The effectiveness of the EP 1087041 process is well appreciated. However, the process of using the CZ method to grow a high resistivity silicon single crystal ingot with interstitial oxygen concentration of 10 to 25 ppma, processing the ingot into a wafer, and subjecting the wafer to an oxygen precipitation heat treatment whereby the residual interstitial oxygen content in the wafer is reduced to about 8 ppma or less consumes large amounts of energy and takes up valuable process time, usually more than 20 hours.

The invented method crosses the dividing line between wafer fabrication and device fabrication. As used herein, "wafer fabrication" refers to the processes relating to the production of a silicon crystal wafer capable of receiving electronic devices upon its surface. As used herein, "device fabrication" refers to the fabrication of electronic devices, or of those components which act to complement electronic devices, upon or within the surface portion of a silicon wafer.

Until now, the processes related to wafer fabrication and the processes related to device fabrication have remained divided. The objective of high resistivity wafer fabricators has been to produce a high resistivity silicon wafer with a particular resistivity which would, hopefully, remain unchanged throughout heat treatment processes experienced subsequent to wafer fabrication. Likewise, the objective of device fabricators is to obtain high resistivity silicon wafers with a known resistivity which will not vary unpredictably when exposed to heat treatments associated with device fabrication.

The invented method comprises a) using the CZ method to grow a silicon single crystal ingot with a resistivity of 100 $\Omega \cdot$cm or more and an initial interstitial oxygen concentration of 10 to 25 ppma, b) processing the ingot into a wafer, c) determining the amount of heat treatment required to reduce the interstitial oxygen content of the wafer to about 8 ppma or less, d) determining the amount of heat treatment which will take place during the device fabrication process after wafer fabrication, and e) subjecting the wafer to a partial oxygen precipitation heat treatment equivalent to the amount of heat treatment determined in step c, less the amount of heat treatment determined in step d.

The invented method utilizes the heat treatment that is necessary during the fabrication of devices upon the surface of the wafer to concurrently precipitate oxygen within the wafer, thereby utilizing the same thermal energy for oxygen precipitation heat treatment and device fabrication heat treatment without the need for separate process steps. The object of the invention is to produce an intermediately precipitated wafer, with an amount of precipitation calculated such that heat treatments encountered in subsequent device fabrication processes further precipitate the oxygen to a final desired value.

The heat treatment of the invented method causes the precipitation of the interstitial oxygen content within the wafer, which prevents the oxygen components from becoming electrically active electron donors and from reducing the resistivity of the wafer. The oxygen is precipitated to an intermediate level by heat treatment during the wafer fabrication process. Then, heat treatment from a later device fabrication operation further precipitates the oxygen to a final value, corresponding to a bulk defect value of approximately $1 \times 10^8$ to about $2 \times 10^{10}$ defects/cm$^3$. It is preferred that the wafer have a resistivity of 1000 Ω·cm or more prior to the device fabrication stage.

The oxide precipitates formed within the bulk portion of the wafer also provide gettering within the bulk portion of the wafer to prevent contaminants within the bulk portion from moving to the surface portion of the wafer.

a. Growing the Crystal and b. Slicing into Wafer

The general method of growing silicon ingots according to the CZ method and thereafter slicing the ingots into silicon wafers is known in the art. General reference on performing the CZ method is provided by Ullmann's Encyclopedia of Industrial Chemistry, vol. A23, p.727–731 (1993) and further by Van Zant, Peter, Microchip Fabrication, Fourth Edition, p.53–55 (2000).

An exemplary structure of an apparatus for pulling a silicon crystal by the CZ method is explained by referring to FIG. 1. As shown in FIG. 1, the apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and a rotation mechanism therefore (not shown), seed chuck 6 for holding a silicon seed crystal 5, cable 7 for pulling the seed chuck 6, and winding mechanism (not shown) for rotating and winding the cable 7. The crucible 32 is composed of an inner quartz crucible for accommodating a silicon melt 2, and an outer graphite crucible. Further, insulating material 35 surrounds the outside of the heater 34. A cylindrical cooling apparatus (not shown) for cooling the single crystal by jetting cooling gas, or shielding radiant heat may be provided.

In operation of the exemplary apparatus, a silicon polycrystalline is melted in the crucible 32 at a temperature higher than about 1420° C. A tip end of the seed crystal 5 is brought into contact with, or immersed into the surface of the melt 2 at its approximate center portion by reeling out the cable 7. The crucible-holding shaft 33 is rotated in an optional direction, and the seed crystal 5 is simultaneously pulled upwardly by winding up the cable 7 with rotating the cable to start the growing of single crystal. Thereafter, a single crystal ingot 1 approximately in a cylindrical shape is obtained by appropriately controlling the pulling rate and temperature.

The amount of initial interstitial oxygen, the amount of interstitial oxygen residing within the silicon crystal after production of the crystal but prior to any precipitation heat treatment, should be between about 10 ppma and 40 ppma. A minimum amount of initial interstitial oxygen is required to form oxide precipitate within the silicon so that an effective amount of gettering takes place within the crystal. 10 ppma is an approximate minimum amount of interstitial oxygen that should be present before heat treating. Conversely, exceedingly high amounts of interstitial oxygen in the beginning crystal lead to excessive precipitation which tends to weaken the structure of the crystal. An approximate upper limit of initial interstitial oxygen content is 40 ppma. The upper limit of initial interstitial oxygen content will most typically be about 25 ppma. It is noted that lower or higher amounts of initial oxygen content may be used, but the resulting wafer would have reduced gettering capacity or increased degradation of physical structure, respectively.

The amount of oxygen which enters the crystal in the first place may be controlled somewhat through variations in the rate of rotation of the crucible, the amount and flowrate of gas within the CZ chamber, the pressure of the atmosphere within the CZ chamber, and temperature distribution within the silicon melt.

Optionally, process variables may be adjusted so that the amount of interstitial oxygen contained within the silicon ingot remains constant along the direction of pull. It is desirable that the concentration of oxygen not vary as the ingot is pulled from the polysilicon melt of the CZ process. Variations in oxygen content are caused by variable oxygen in the quartz crucible, varying levels of polysilicon within the crucible, and the amount of silicon oxide that is allowed to vaporize from the silicon melt. Methods of controlling these variables may be used to obtain a uniform oxygen concentration in the direction of pull of the crystal. EP 0837159A1 describes such a method.

After the completion of crystal growth, the grown silicon ingot is sliced into wafers using techniques commonly available in the art of silicon wafer processing.

c. Determining the Total Heat Treatment Required

The total heat treatment required for a wafer is the total heat treatment required to reduce the residual interstitial oxygen content of a wafer to a final desired value, typically less than 8 ppma or less than 6 ppma. This value will vary depending on factors such as oxygen content of the wafer, thickness of the wafer, defect content of the wafer, previous doping of the wafer, and other previous chemical or thermal treatments of the wafer.

The total heat treatment required for a particular type of wafer may be determined experimentally by measuring the oxygen concentration of wafer samples subjected to various degrees of heat treatment. Interstitial oxygen concentration may be measured, for example, using a QS-300 instrument, produced by BioRad, which is a measurement apparatus based on infrared spectroscopy.

Alternatively, the total heat treatment required may be calculated if the properties of the wafer are known and the behavior of the oxygen within the wafer when subjected to heat treatment is also known.

d. Determining the Heat Treatment Which Will Occur During Device Fabrication

The total value of heat treatment which will occur subsequent to wafer fabrication will be predetermined. The heat treatment which takes place during each device fabrication step will be known by the device fabricator, and the total heat treatment may be easily calculated once the total number and type of device fabrication steps are known.

If the amount of heat treatment required prior to device fabrication is already known because of previous experience, experimentation, or calculation, then the values of heat treatment need not be repeatedly determined.

e. Partial Oxygen Precipitation Heat Treatment

A silicon wafer treated in accordance with the invented method has an intermediate interstitial oxygen concentration such that heat treatments which occur during subsequent device fabrication processes will result in a wafer with a final interstitial oxygen concentration of 8 ppma or less and an oxide precipitate density of $1 \times 10^8$ to $2 \times 10^8$ precipitates/cm$^3$. The final residual interstitial content is typically below 6 ppma.

The intermediate interstitial oxygen value of the silicon wafer is necessarily less than the original 10 to 40 ppma value, but greater than the anticipated final value, which is 8 ppma or less. The wafers with the intermediate oxygen values may be stored or shipped to a device fabrication facility where they will be further heat treated until the final interstitial oxygen concentration is reached.

The desired favorable qualities associated with high resistivity are typically encountered at resistivities above about 100 Ω·cm. Therefore, the resistivity of the silicon wafer should be greater than 100 Ω·cm both before and after the oxygen precipitation heat treatment. Resistivity may certainly be higher than 100 Ω·cm and may be tailored to the demands of the device fabricator. In one embodiment, the wafer has a resistivity of 1000 Ω·cm or more both before and after the oxygen precipitation heat treatment.

It should be noted that the oxygen precipitation heat treatment described herein may be successfully utilized at any point in a polishing, etching, or deposition process but is preferably performed prior to the final polishing of the wafer.

Although the precipitated oxygen is desirable within the bulk portion of the wafer due to its gettering ability, oxygen is not desired in the surface portion of the wafer, where the electronic devices of the microchip are installed. To remove oxygen from the surface of the wafer, the wafer is optionally heat treated at about 900° C. or higher, preferably between about 1100° C. and 1250° C., which out-diffuses the interstitial oxygen from the surface of the wafer and creates a denuded zone (DZ layer). Upon a denuding heat treatment, oxygen is out-diffused from the surface of the wafer. The out-diffusion results in an oxygen gradient within the surface of the wafer, with oxygen content increasing with depth. The longer the wafer is subjected to high-temperature heat treatment, the deeper the resulting denuded zone will extend within the wafer.

By way of example, at a temperature of 1150° C., a typical wafer should be heat treated for approximately 30 minutes to provide a 10 µm thick DZ layer with an oxygen concentration of 1 ppma or less at the wafer surface. Heat treatment for approximately 2 hours provides a 20 µm thick DZ layer with an oxygen concentration of 1 ppma or less at the wafer surface. The high-temperature heat treatment preferably occurs in a nitrogen or other inert atmosphere.

For the mass production of wafers, a batch heat treatment furnace may be used for the heat treatment of the wafers. Use of the furnace allows for the simultaneous heat treatment of several wafers, lowering the required per wafer process time. The heat treatment furnace is capable of maintaining elevated temperatures within a predetermined range and is capable of rapidly increasing and decreasing the temperature within the furnace. The atmosphere within the furnace is also carefully controlled and is typically argon, nitrogen, or other inert or nearly inert gas.

In an alternative embodiment, it is provided that a partially oxygen precipitated silicon wafer as described above may form the bond layer, base layer, or both layers of a silicon on insulation (SOI) wafer. In such a situation, the thin oxide film joining the layers is heated and fused during the wafer fabrication processing. The heating required to fuse the bond and base layers together is included in the total heat treatment required for the desired oxygen precipitation.

If the SOI wafers are produced with the simultaneous oxygen precipitation heat treatment and SOI bonding heat treatment steps, the first portion of the oxygen precipitation heat treatment is preferably performed prior to the final polishing of the upper surface of the base wafer. This is because slight alterations in the surface of the base wafer may occur as oxygen and other impurities near the surface of the wafer are off-gassed during heat treatment. Thus, final polishing of the upper surface of the base layer should be accomplished after the initial stages of the oxygen precipitation heat treatment but before mating the base layer with the oxide layer and the bond wafer.

An epitaxial layer may optionally be deposited upon a surface of the high resistivity wafer during the wafer fabrication process. In the case of epitaxial deposition, the surface of the wafer should be high temperature heat treated, to remove interstitial oxygen from the surface of the wafer, as described above before deposition of the epitaxial layer, though oxygen precipitation heat treatment may be continued after wafer fabrication. Deposition of the epitaxial layer provides an overall wafer having a high resistivity, a defect free surface, and a bulk portion with low interstitial oxygen content and improved gettering ability.

Another benefit gained from subjecting the wafer obtained from a silicon single crystal ingot having an initial interstitial oxygen concentration of 10 to 40 ppma to an oxygen precipitation heat treatment so that a residual interstitial oxygen concentration in the wafer should become 8 ppma or less, and preferably 6 ppma or less as described above, is that precipitated oxygen and residual interstitial oxygen formed in the bulk portion of the wafer act to suppress slip dislocations. The tendency to suppress slip dislocations is surprising, given the fact that oxide precipitation within a wafer typically promotes slip dislocations.

The resistance to slip dislocations enables the wafer to be mechanically handled during heat treatment without defects developing within the wafer due to mechanical and thermal stresses upon the wafer. The practical effect of the slip dislocation suppression is that the wafers may be handled in heat treatment boats or other heat treatment equipment without imparting defects to the wafer.

By utilizing heat treatment that occurs during device installation to complete oxygen precipitation within a silicon wafer to a desired value, thermal energy and time required to fabricate a high resistivity wafer are reduced.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A process of forming a high-resistivity silicon wafer having partially precipitated interstitial oxygen comprising:

a. growing a silicon single crystal ingot having a resistivity of 100 Ω·cm or more and having an initial interstitial oxygen concentration of from about 10 to about 40 ppma, b. processing the ingot into a wafer, c. determining the total amount of heat treatment required to reduce the interstitial oxygen content of the wafer to about 8 ppma or less, d. determining the amount of heat treatment which will take place during the device fabrication process after wafer fabrication, and e. subjecting the wafer to a partial oxygen precipitation heat treatment equivalent to the total amount of heat treatment required to reduce the interstitial oxygen content of the wafer to about 8 ppma or less, less the amount of heat treatment which will take place during device fabrication.

2. The process of claim 1, wherein the ingot is grown according to the Czochralski (CZ) method.

3. The process of claim 1, wherein the step of subjecting the wafer to a partial oxygen precipitation includes subjecting the wafer to a high temperature heat treatment for out-diffusing oxygen.

4. The process of claim 1, wherein the step of determining the total amount of heat treatment required comprises determining the amount of heat treatment required to reduce the interstitial oxygen content of the wafer to about 6 ppma or less.

5. The process of claim 1, wherein the step of subjecting the wafer to a partial oxygen precipitation heat treatment includes a heat treatment occurring between about 800° C. and about 1050° C.

6. The process of claim 1, wherein the step of determining the total amount of heat treatment required comprises determining the total amount of heat treatment required to reduce the interstitial oxygen content of the wafer to about 8 ppma or less and to provide a bulk defect density of between $1 \times 10^8$ and $2 \times 10^{10}$ defects/cm$^3$.

7. The process of claim 1, further comprising depositing an epitaxial layer on said wafer.

8. The process of claim 1, wherein the high-resistivity wafer has opposed first surface and second surfaces, and further comprising bonding a second silicon wafer to the first surface of the high-resistivity wafer to form a single silicon on insulation (SOI) wafer.

9. The process of claim 8, wherein the high-resistivity wafer and the second silicon wafer are bonded by a thin oxide film disposed between the wafers.

10. The process of claim 1, wherein the step of growing a silicon crystal ingot comprises growing a crystal ingot having a resistivity of 1000 Ω· cm or more.

11. A process of partially precipitating interstitial oxygen within a high-resistivity wafer comprising:

determining a heat treatment amount equivalent to the total amount of heat treatment required to reduce the interstitial oxygen content of the wafer to about 8 ppma or less, minus the amount of heat treatment which will take place during the device fabrication process after wafer fabrication, growing a silicon single crystal ingot having a resistivity of 100 Ω·cm or more and having an initial interstitial oxygen concentration of from about 10 to about 40 ppma, processing the ingot into a wafer, and heat treating the wafer by the determined heat treatment amount.

12. The process of claim 11, wherein the ingot is grown according to the Czochralski (CZ) method.

13. The process of claim 11, wherein the step of heat treating the wafer includes subjecting the wafer to a high temperature heat treatment for out-diffusing oxygen.

14. The process of claim 11, wherein the step of determining the total amount of heat treatment required comprises determining the amount of heat treatment required to reduce the interstitial oxygen content of the wafer to about 6 ppma or less.

15. The process of claim 11, wherein the step of heat treating the wafer includes a heat treatment occurring between about 800° C. and about 1050° C.

16. The process of claim 11, wherein the step of determining the total amount of heat treatment required comprises determining the total amount of heat treatment required to reduce the interstitial oxygen content of the wafer to about 8 ppma or less and to provide a bulk defect density of between $1 \times 10^8$ and $2 \times 10^{10}$ defects/cm$^3$.

17. The process of claim 11, further comprising depositing an epitaxial layer on said wafer.

18. The process of claim 11, wherein the high-resistivity wafer has opposed first surface and second surfaces, and further comprising bonding a second silicon wafer to the first surface of the high-resistivity wafer to form a single silicon on insulation (SOI) wafer.

19. The process of claim 18, wherein the high-resistivity wafer and the second silicon wafer are bonded by a thin oxide film disposed between the wafers.

* * * * *